(12) United States Patent
Wegleiter et al.

(10) Patent No.: US 9,972,759 B2
(45) Date of Patent: May 15, 2018

(54) OPTOELECTRONIC SEMICONDUCTOR DEVICE HAVING CONTACT TRACK WITH RELIEVED THERMO-MECHANICAL STRESS

(71) Applicant: OSRAM Opto Semiconductors GmbH, Regensburg (DE)

(72) Inventors: Walter Wegleiter, Nittendorf (DE); Paola Altieri-Weimar, Regensburg (DE); Juergen Moosburger, Lappersdorf (DE); Stefan Stegmeier, Munich (DE); Karl Weidner, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 18 days.

(21) Appl. No.: 14/766,420

(22) PCT Filed: Jan. 23, 2014

(86) PCT No.: PCT/EP2014/051326
§ 371 (c)(1),
(2) Date: Aug. 6, 2015

(87) PCT Pub. No.: WO2014/122029
PCT Pub. Date: Aug. 14, 2014

(65) Prior Publication Data
US 2016/0005940 A1 Jan. 7, 2016

(30) Foreign Application Priority Data
Feb. 8, 2013 (DE) .......... 10 2013 101 260

(51) Int. Cl.
*H01L 31/0203* (2014.01)
*H01L 31/02* (2006.01)
(Continued)

(52) U.S. Cl.
CPC ............. *H01L 33/62* (2013.01); *H01L 24/18* (2013.01); *H01L 24/24* (2013.01);
(Continued)

(58) Field of Classification Search
CPC ...... H01L 33/0224–33/022491; H01L 31/024; H01L 33/36–33/387; H01L 33/62;
(Continued)

(56) References Cited

U.S. PATENT DOCUMENTS 4,482,807 A * 11/1984 Blackburn ........ H01L 27/14669
250/334
4,665,277 A * 5/1987 Sah ..................... H01L 31/1105
136/249
(Continued)

FOREIGN PATENT DOCUMENTS

DE 102008011862 A1 9/2009
DE 102009036621 A1 2/2011
(Continued)

*Primary Examiner* — Kevin Parendo
(74) *Attorney, Agent, or Firm* — McDermott Will & Emery LLP

(57) ABSTRACT

The invention relates to a device (1), comprising at least one optoelectronic semiconductor component (2) and a substrate (5), on which the semiconductor component is arranged, wherein an insulating layer (4) is adjacent to a lateral surface (25) that bounds the semiconductor component; a contact track (6) is arranged on a radiation passage surface of the semiconductor component and is connected to an electrically conductive manner to the semiconductor component; the contact track extends beyond the lateral surface of the semiconductor component and is arranged on the insulating layer; and the contact track is relieved with respect to a thermomechanical load occurring perpendicularly to the lateral surface.

19 Claims, 6 Drawing Sheets

(51) Int. Cl.
*H01L 31/024* (2014.01)
*H01L 33/48* (2010.01)
*H01L 33/62* (2010.01)
*H01L 33/64* (2010.01)
*H01L 23/00* (2006.01)

(52) U.S. Cl.
CPC .... *H01L 31/02002* (2013.01); *H01L 31/0203* (2013.01); *H01L 31/024* (2013.01); *H01L 33/483* (2013.01); *H01L 33/647* (2013.01); *H01L 2224/04105* (2013.01); *H01L 2224/24137* (2013.01); *H01L 2224/32225* (2013.01); *H01L 2224/32245* (2013.01); *H01L 2224/73267* (2013.01); *H01L 2924/15153* (2013.01)

(58) Field of Classification Search
CPC ........ H01L 33/64–33/648; H01L 2224/48092; H01L 2224/28095–2224/48097; H01L 31/048–31/0481; H01L 31/0475
See application file for complete search history.

(56) References Cited

U.S. PATENT DOCUMENTS

| | | | |
|---|---|---|---|
| 5,158,618 A * | 10/1992 | Rubin | H01L 31/022425 136/244 |
| 5,620,528 A * | 4/1997 | Schade | H01L 31/022425 136/244 |
| 7,709,849 B1 | 5/2010 | Kal et al. | |
| 8,356,640 B1 * | 1/2013 | Nizenkoff | H01L 31/022425 140/123 |
| 2002/0089064 A1 | 7/2002 | Wu | |
| 2003/0047206 A1* | 3/2003 | Kawam | H01L 31/0475 136/244 |
| 2004/0061123 A1* | 4/2004 | Shelton | H01L 33/38 257/99 |
| 2009/0230424 A1 | 9/2009 | Kobayakawa et al. | |
| 2010/0165600 A1* | 7/2010 | Ku | F21K 9/00 362/84 |
| 2011/0291149 A1 | 12/2011 | Sugizaki et al. | |
| 2012/0146066 A1* | 6/2012 | Tischler | H01L 27/156 257/89 |
| 2013/0049060 A1* | 2/2013 | Yu | H01L 33/38 257/99 |
| 2013/0316486 A1* | 11/2013 | Lunch | H01L 31/02008 438/62 |

FOREIGN PATENT DOCUMENTS

| | | |
|---|---|---|
| DE | 102010031732 A1 | 1/2012 |
| DE | 102011011139 A1 | 8/2012 |
| DE | 102011079708 A1 | 1/2013 |

\* cited by examiner

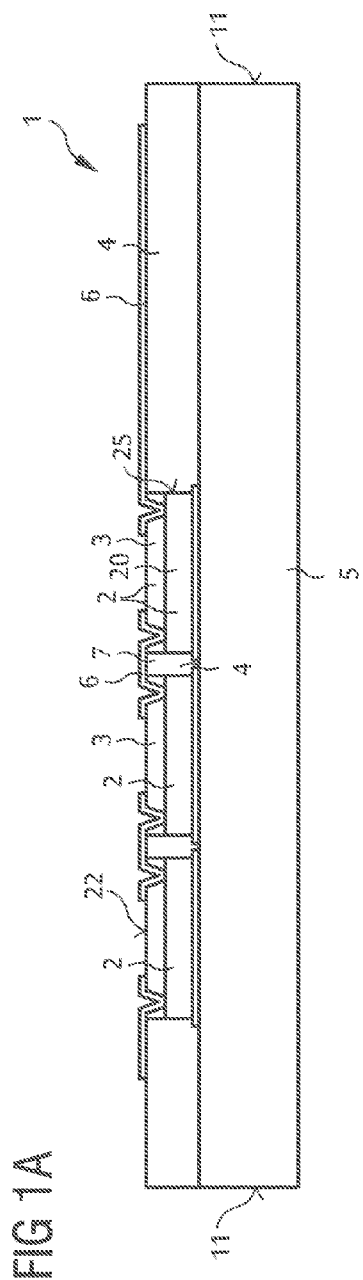
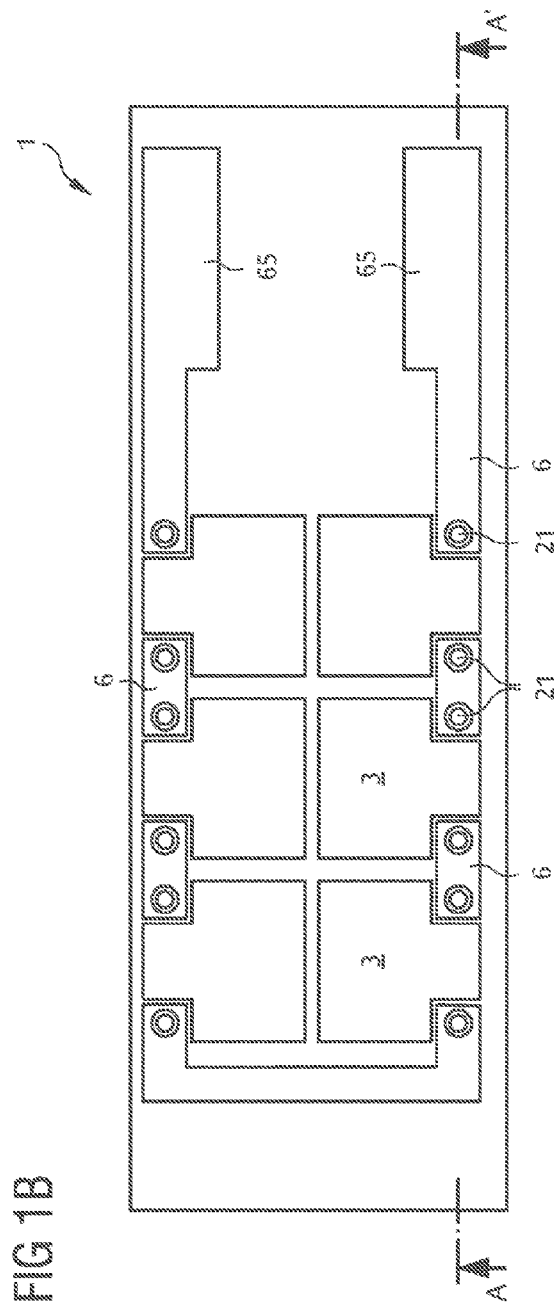
FIG 1A
FIG 1B

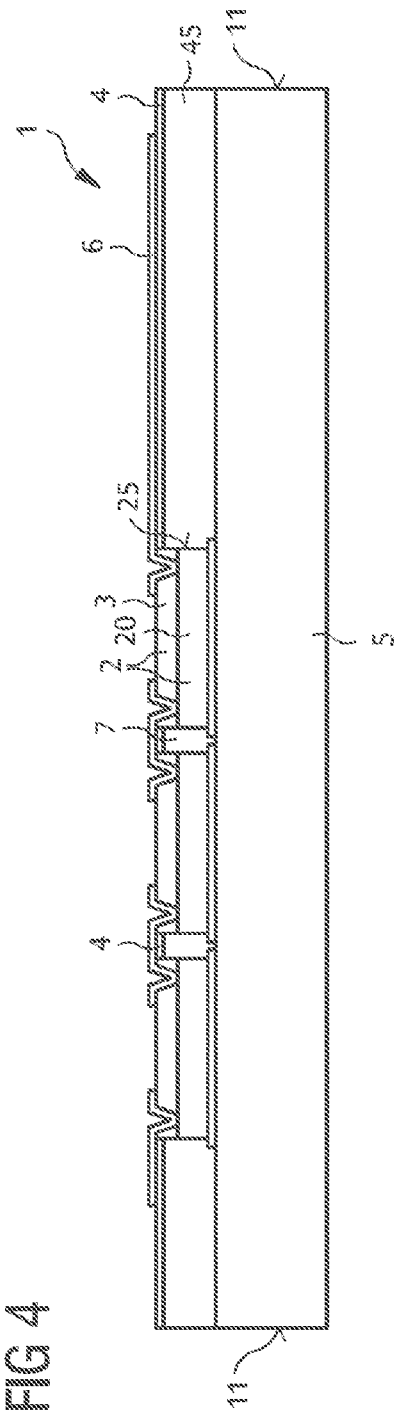
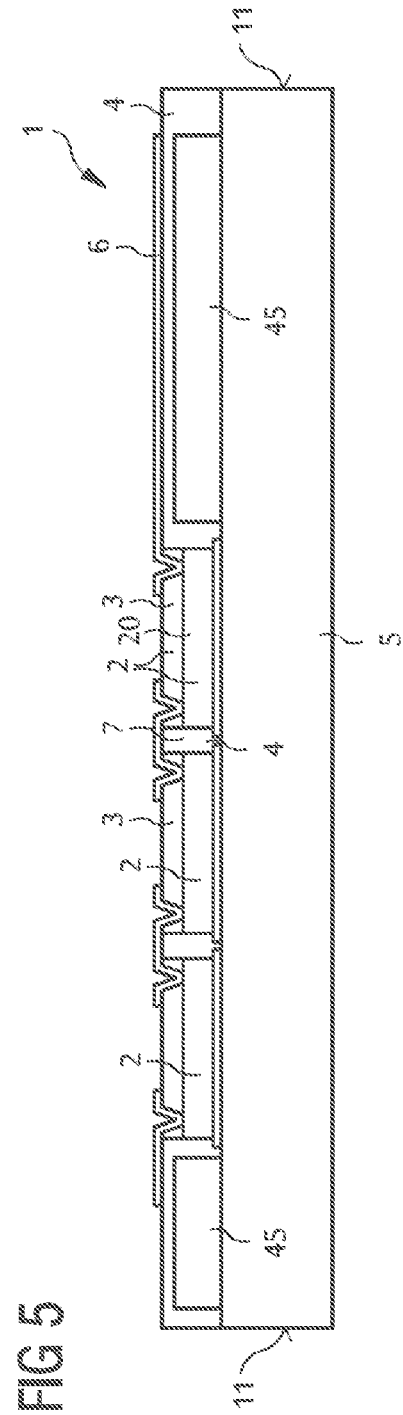

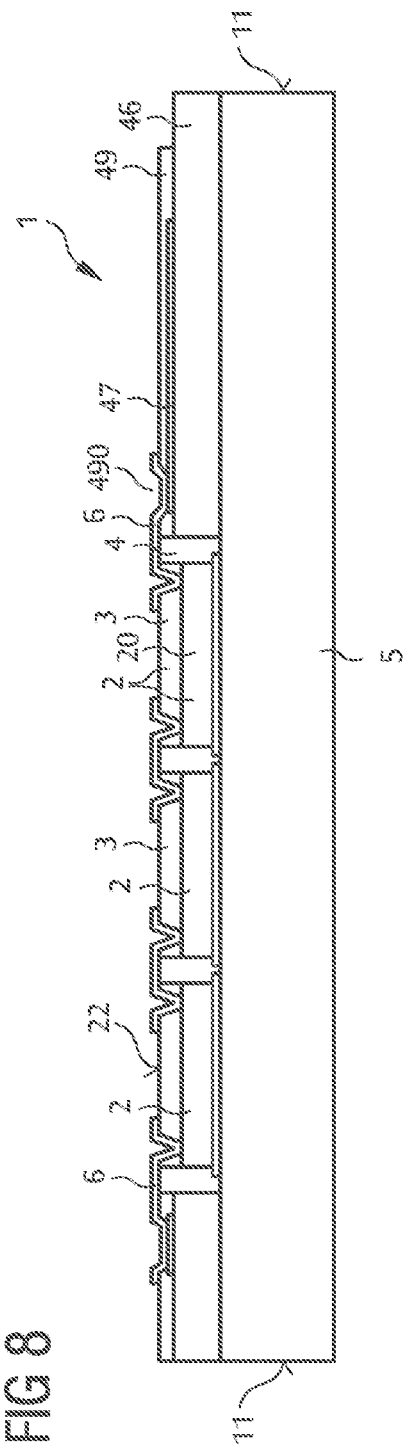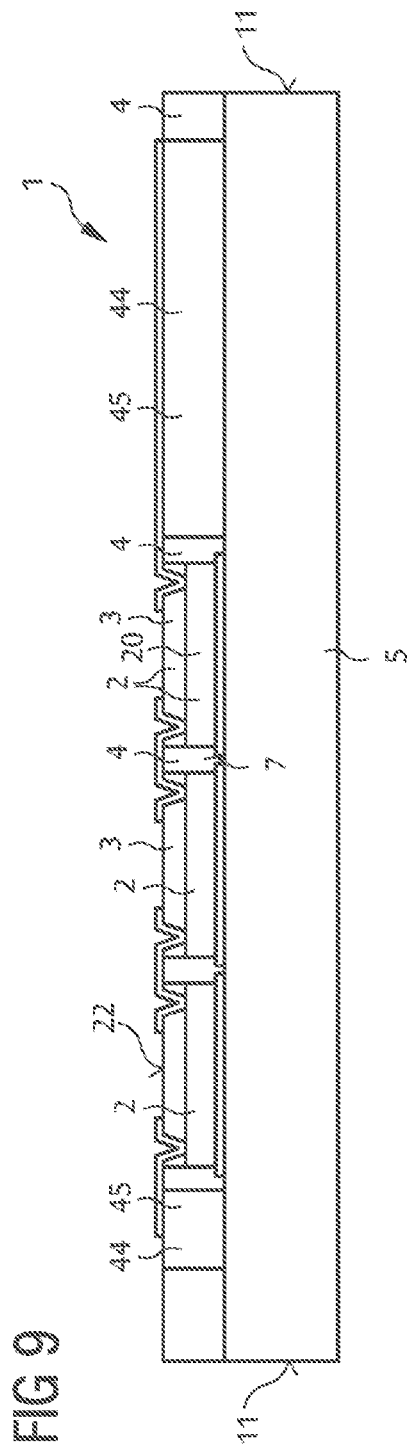

OPTOELECTRONIC SEMICONDUCTOR DEVICE HAVING CONTACT TRACK WITH RELIEVED THERMO-MECHANICAL STRESS

The present application relates to a device having at least one optoelectronic semiconductor component, which is arranged on a carrier.

In optoelectronic devices such as for example LED arrays, waste heat output by the optoelectronic semiconductor chips when the device is in operation may lead to comparatively major temperature changes. Due to different coefficients of thermal expansion of individual layers or regions of the device, such temperature changes may bring about a heavy mechanical load, which may for example lead to breakage of plated tracks and thereby to failure of the device.

It is an object to provide a device which is distinguished by increased reliability with regard to temperature changes.

This object is achieved inter alia by the subject matter of claim 1. Further configurations and convenient aspects constitute the subject matter of the dependent claims.

According to at least one embodiment of the device, the device comprises at least one optoelectronic semiconductor component. The optoelectronic semiconductor component is provided in particular for generating and/or receiving radiation. For example, the optoelectronic semiconductor component emits radiation in the ultraviolet, visible or infrared spectral range. For example, the semiconductor component takes the form of a semiconductor chip, in particular an unhoused semiconductor chip. That is to say, the semiconductor component itself does not have a housing in which the semiconductor chip is arranged. The semiconductor chip contains for example a III-V compound semiconductor material. A radiation conversion element may be arranged on the semiconductor chip, which element is provided for at least partial conversion of a primary radiation generated in the semiconductor chip during operation into a secondary radiation with a peak wavelength other than a peak wavelength of the primary radiation.

The device in particular comprises a plurality of optoelectronic semiconductor components, for example between two and 50 semiconductor components inclusive.

According to at least one embodiment of the device, the device comprises a carrier. The at least one semiconductor component is arranged and in particular fastened on the carrier. The carrier is in particular configured to be electrically insulating. For example, the carrier contains a ceramic, for instance aluminium nitride or boron nitride. Alternatively or in addition, a semiconductor material, for example silicon or germanium, may also be used for the carrier.

According to at least one embodiment of the device, the device comprises an insulation layer. The insulation layer in particular adjoins a side face delimiting the semiconductor component. For example, the insulation layer completely encloses the semiconductor component in the lateral direction. In the vertical direction the insulation layer may cover the entire side face of the semiconductor component at least in places.

A lateral direction is understood to be a direction which extends parallel to a main plane of extension of the carrier. Accordingly, a vertical direction denotes a direction which extends perpendicular to the main plane of extension of the carrier.

In the case of a semiconductor component with a radiation conversion element, the insulation layer in particular also adjoins the radiation conversion element. The insulation layer may for example contain a polymer material, for instance a silicone, a resin or a hybrid material of at least one silicone and one resin or consist of such a material.

The insulation layer preferably has a reflectivity of at least 80% for the radiation to be generated and/or received by the semiconductor component when the device is in operation. For example, particles, for instance white pigments, are formed in the insulation layer. For example, a polymer material filled with titanium dioxide as white pigment is distinguished by a reflectivity of 85% or more.

According to at least one embodiment of the device, the device comprises a contact track. The contact track is arranged on a radiation passage face of the semiconductor component and connected electrically conductively with said semiconductor component. For example, the contact track is provided for connecting the at least one semiconductor component electrically conductively with a contact surface provided for external electrical contacting of the device. Furthermore, the contact track may also be provided for electrically conductive connection between two semiconductor components of the device. The contact track extends in places on the insulation layer. In particular, the contact track adjoins the insulation layer.

The contact track extends in particular beyond the side face of the semiconductor component. In plan view onto the device, the contact track thus projects beyond the semiconductor component at least in places in the lateral direction. A wire bond connection for the production of electrical, contacting of the semiconductor component may be dispensed with.

According to at least one embodiment of the device, the contact track is relieved with regard to thermo-mechanical stress, for instance a tensile load, arising perpendicular to the side face in particular during operation of the device.

In at least one embodiment of the device, the device comprises at least one optoelectronic semiconductor component and a carrier, on which the semiconductor component is arranged. An insulation layer adjoins a side face delimiting the semiconductor component. A contact track is arranged on a radiation passage side of the semiconductor component and connected electrically conductively with the semiconductor component. The contact track extends beyond the side face of the semiconductor component and is arranged on the insulation layer. The contact track is relieved with regard to thermo-mechanical stress arising perpendicular to the side face when the device is in operation.

Relief of the contact track with regard to the thermo-mechanical stress arising minimises the risk that temperature changes occurring in operation, for example due to different coefficients of thermal expansion for the carrier and the insulation layer, might lead to breakage of one or more contact tracks. The long-term stability of the device during operation thereof is thus increased significantly.

According to at least one embodiment of the device, the insulation layer and the carrier terminate flush at a side face of the device. During production of the device, a plurality of devices may be produced simultaneously next to one another and subsequently singulated. During singulation into the devices, the insulation layer and carrier are severed, such that the insulation layer and carrier terminate flush at the side face of the device which arises on singulation.

According to at least one embodiment, the contact track has a ductility of at least 10%. For example, the ductility is between 15% and 25% inclusive. The higher the ductility of a material, the more said material may deform under load before it tears. It has been found that such a high-ductility contact track leads to a reduction in the thermo-mechanical stress affecting the contact track and reduces the risk of breakage. For example, an electro-deposited copper material is suitable for the contact track.

The contact track may be of single-layer or multilayer construction. For example, the contact track may comprise a first layer and a second layer, wherein the first layer contains titanium and the second layer copper.

According to at least one embodiment of the device, the contact track is free of nickel. It has been found that nickel may form excessively brittle surfaces, such that nickel-containing contact tracks may break at comparatively low thermo-mechanical loads. In particular, in the case of a multilayer contact track all the layers are free of nickel.

According to at least one embodiment of the device, the contact track is structured in the lateral direction in such a way that a spring effect arises perpendicular to the side face of the semiconductor component. By means of the spring effect, the contact track may be simply relieved with regard no thermo-mechanical stresses. Alternatively or in addition, the insulation layer is structured in the lateral direction and/or in the vertical direction in such a way as to bring about or reinforce a spring effect.

According to at least one embodiment, the contact track comprises a serpentine structure. In particular, the serpentine structure comprises at least two turns.

According to at least one embodiment of the device, the contact track is structured with at least one cutout. The cutout extends in particular in the vertical direction completely through the contact track. In particular, a plurality of cutouts may be provided, which for example form a honeycomb or pore-like structure of the contact track. It has been found that, by means of one or more cutouts, reversible mechanical deformation of the contact tracks in response to thermo-mechanical stress of the device may be promoted. In this way, the occurrence of breaks in the contact track can be avoided.

According to at least one embodiment of the device, the at least one cutout forms two sub-regions of the contact track, which, in plan view onto the device, extend parallel to one another at least in places. The sub-regions are connected together electrically conductively and, when the device is in operation, are at the same electrical potential. Due to the diminished transverse extent of the individual sub-regions of the contact track, the contact track may be distinguished overall, in comparison with an individual contact track without sub-regions, by a higher loading capacity with regard to thermo-mechanical stresses for the same current-carrying capacity.

According to at least one exemplary embodiment, the contact track has a thickness, i.e. a vertical extent, of at most 30 µm. Preferably, the thickness of the contact track is between 5 µm and 15 µm inclusive.

It has been found that, with the stated layer thicknesses for the contact track, reduced sensitivity to thermo-mechanical stresses may be achieved. The width of the contact track is conveniently adapted to the layer thickness in such a way that the cross-section of the contact track is sufficiently large to ensure a sufficiently high current-carrying capacity.

According to at least one embodiment of the device, in the lateral direction outside the semiconductor component or the semiconductor components the device comprises a further layer arranged between the carrier and contact track. The term "further layer" generally denotes an element arranged between the carrier and the contact track. The further layer may be formed directly on the carrier, for example in the form of a coating or in the form of a moulding composition applied to the carrier. The further layer may however also be a prefabricated element fastened to the carrier. The sum of the layer thicknesses of the further layer and the insulation layer corresponds in particular to the distance between the radiation passage face of the semiconductor component and the carrier. The further layer allows the thickness of the insulation layer to be reduced, without modifying the di stance between the surface of the insulation layer remote from the carrier and the carrier. Conveniently, the further layer is better adapted to the carrier with regard to the coefficient of thermal expansion than the insulation layer. This means than the magnitude of the difference between the coefficient of thermal expansion of the further layer and the coefficient of thermal expansion of the carrier is smaller, for example by at least 20%, than the magnitude of the difference between the coefficient of thermal expansion of the insulation layer and the coefficient of thermal expansion of the carrier. The further layer may contain a metal or a metal alloy, a semiconductor material or a plastics material.

According to at least one embodiment of the device, the further layer is arranged in an indentation in the insulation layer. In particular, in plan view onto the device the indentation overlaps with the contact track at least in places. In the region of the indentation the insulation layer has a lower thickness compared to a point of the insulation layer no the side of the indentation. The indentation may extend vertically completely or only partly through the insulation layer. The further layer fills the indentation completely or at least in places. In the case of a completely filled indentation, the contact track may extend in planar manner over the further layer arranged in the indentation in the insulation layer. In the case of an electrically conductive further layer, the further layer in the indentation may also form a through-via.

According to at least one embodiment of the device, the insulation layer is arranged on the side of the further layer remote from the carrier. Preferably, the insulation layer completely covers the further layer. In plan view onto the device, the further layer is thus not visible and may therefore be selected in particular irrespective of its optical properties.

According to at least one embodiment of the device, the insulation layer is arranged between the further layer and the semiconductor component. In this embodiment, the layer thickness of the insulation layer and the layer thickness of the further layer may be identical or substantially identical, i.e. with a difference from one another of at most 10%.

For example, the further layer comprises a terminal carrier with conductor tracks and the contact track is guided over the insulation layer to the terminal carrier.

According to at least one embodiment of the device, the carrier comprises a depression in which the at least one semiconductor component is arranged. In particular, in a configuration with a plurality of semiconductor components all the semiconductor components may be arranged in a common depression.

The vertical extent of the depression is preferably such that the radiation passage face of the semiconductor component terminates flush with the insulation layer at the side face of the semiconductor component. The contact track may thus be guided smoothly, i.e. without an abrupt transition, over the side faces of the semiconductor component.

According to at least one embodiment of the device, the insulation layer comprises a ramp region, in which the thickness of the insulation layer decreases as the distance from the semiconductor component increases. In particular, the insulation layer ends, on the side facing the semiconductor component, at the level of the radiation passage face of the semiconductor component. On the side of the ramp region remote from the semiconductor component, the insulation layer may have a comparatively small thickness. For example, the thickness of the insulation layer amounts in this region to at most 50%, preferably at most 20% of the vertical extent of the optoelectronic semiconductor component. The occurrence of thermo-mechanical stresses due to different coefficients of thermal expansion between the insulation layer and the carries is thus reduced. The insulation layer is conveniently at least thick enough in this region for it to have a sufficiently high reflectivity for the radiation to be received and/or generated by the semiconductor component.

Further features, embodiments and convenient aspects are revealed by the following description of the exemplary embodiments in conjunction with the figures, in which:

FIGS. 1A and 1B show a first exemplary embodiment of a device in schematic plan view (FIG. 1B) and associated sectional view (FIG. 1A);

FIGS. 4 to 9 each show a further exemplary embodiment of a device in schematic sectional view.

Identical, similar or identically acting elements are provided with identical reference numerals in the figures.

Figure 2A:
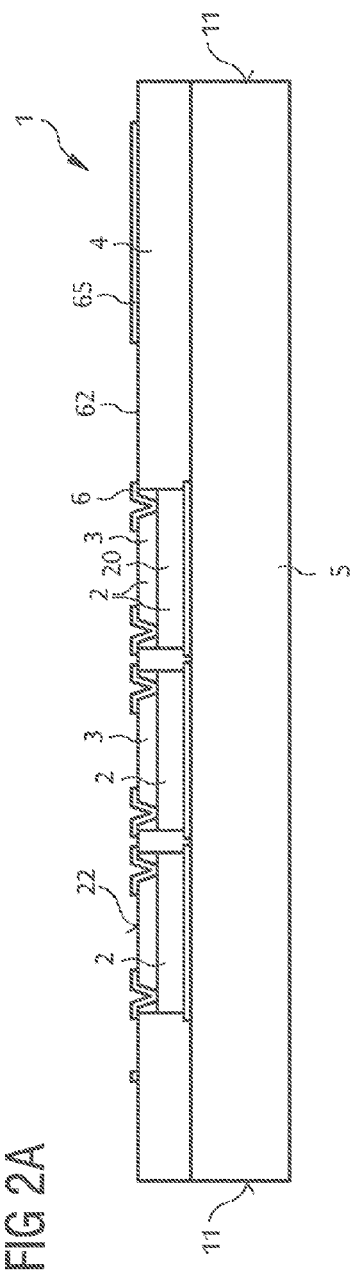
FIGS. 2A and 2B show a second exemplary embodiment of a device in schematic plan view (FIG. 2B) and associated sectional view (FIG. 2A)

The figures are in each case schematic representations and are therefore not necessarily true to scale. Rather, comparatively small elements and in particular layer thicknesses may be illustrated on an exaggeratedly large scale for clarification.

A first exemplary embodiment of a device is shown in schematic plan view in FIG. 1A and an associated sectional view along line AA' is shown in FIG. 1B.

The device 1 comprises a carrier 5, on which a plurality of semiconductor components 2 is fastened. An insulation layer 4 is arranged on the carrier. The insulation layer 4 in each case adjoins the side faces 25 of the semiconductor components 2. In particular, the interspaces 7 between adjacent semiconductor components are filled with the insulation layer 4. Furthermore, the insulation layer 4 adjoins the carrier 5. The insulation layer may be formed directly on the carrier, for example by injection moulding, by transfer moulding or by a dispenser. Suitable materials for the carrier are for example a ceramic, for instance aluminium nitride or boron nitride, or a semiconductor material, for instance silicon or germanium. A metallic carrier, for example a copper carrier or an aluminium carrier, may also be used.

In the lateral direction the device 1 is delimited by side faces 11. At the side faces 11 the insulation layer 4 and the carrier 5 terminate flush with one another at least in places.

The semiconductor component 2 comprises a radiation passage face 22 on a side remote from the carrier 5. The semiconductor components 2 each comprise a semiconductor body 20 with an active region (not explicitly illustrated) provided for generating and/or receiving radiation. The semiconductor components 2 themselves are of unhoused construction. Furthermore, the semiconductor component 2 in each case comprises a radiation conversion element 3. The radiation conversion element 3 is arranged on the semiconductor body 20 and provided for converting radiation emitted by the semiconductor body 20 at least in part into secondary radiation. For example, the radiation conversion element 3 may be provided to convert radiation in the blue spectral range emitted by the semiconductor component 2, in particular by the active region of the semiconductor body, in part into radiation in the yellow spectral range, such that the semiconductor component emits radiation which overall appears white to the human eye.

Depending on the radiation to be generated by the semiconductor component 2, it is also possible to dispense with the radiation conversion element 3 in this case the semiconductor body 20 or a layer arranged on the semiconductor body 20 may form the radiation passage face 22.

The semiconductor components 2 are fastened to the carrier 5 via a bonding layer 8, for instance an adhesive layer or solder layer.

The insulation layer 4 is reflective for the radiation to be generated. For the insulation layer a polymer material is suitable, for example silicone, which is filled with particles, for instance titanium dioxide particles, to increase reflectivity.

The insulation layer 4 completely covers the side face 25 of the semiconductor component 2, in particular the side face of the semiconductor body 20. In this way it is ensured that the radiation generated in operation cannot exit laterally, but rather only through the radiation passage face 22. The insulation layer 4 also adjoins the radiation conversion element 3, such that the radiation, which would exit laterally from the radiation conversion element, is reflected back into the semiconductor component by the insulation layer.

To produce an electrically conductive connection of the semiconductor components 2, the semiconductor components each comprise terminals 21. The terminals 21 are each electrically conductively connected with a contact track 6. In the exemplary embodiment shown, six semiconductor components are shown, merely by way of example. The semiconductor components may comprise two front terminals, i.e. two terminals on the radiation passage face 22 or one front and one back terminal. The semiconductor components may be interconnected individually or in groups in parallel and/or in series.

The device 1 further comprises contact surfaces 65 for external electrical contacting of the device. On application of an electrical voltage between the contact surfaces 65, charge carriers may be injected via the contact tracks 6 into the semiconductor bodies 20 of the semiconductor components 2 and there recombine with the emission of radiation.

At the level of the side face 25 of the semiconductor component the contact track 6 extends in planar or substantially planar manner beyond the side face 25 on a surface of the insulation layer 4 remote from the carrier 5. The contact tracks 6 bring about planar contacting of the semiconductor components without the use of wire bond connections.

To relieve the contact track mechanically in the event of thermo-mechanical stresses arising during operation of the device and acting perpendicular to the side face 25 of the semiconductor component, the contact tracks 6 have a ductility of at least 10%.

The risk of the contact track 6 breaking due to the different coefficients of expansion of the insulation layer 4 and of the carrier 5, in particular in the region of the side face 25 of the semiconductor component, may be significantly reduced thereby.

The contact track 6 may be of single-layer or multilayer construction, for example a configuration with a titanium sublayer and a copper sublayer is suitable for the contact track. With a copper contact track with a layer thickness of 40 µm it was possible to achieve a ductility of between 15% and 25% inclusive, a tensile strength of between approximately 250 N/mm2 and 400 N/mm2, a breaking strength of approximately 150 N to 200 N and elongation of approximately 15% to approximately 30%.

In contrast to this, conventional, contact tracks containing for example nickel are more brittle and therefore more sensitive to thermal stresses.

Alternatively or in addition to configuration of the contact track using a high-ductility layer, relief of thermo-mechanical stress may also be achieved by reducing the thickness of the contact track. To this end, the thickness of the contact track 6 amounts to at most 30 µm. Preferably, the thickness of the contact track is between 5 µm and 15 µm inclusive. It has been found that a contact track in this thickness range results in good mechanical stability with simultaneously good current carrying capacity.

With reference to subsequent figures, further exemplary embodiments are described in which the contact track is relieved with regard to thermo-mechanical stress arising perpendicular to the side face 25 when the device is in operation. The measures described in connection with these exemplary embodiments may be used as an alternative or in addition to the high-ductility configuration and/or the reduced thickness of the contact tracks 6.

Figure 2B:
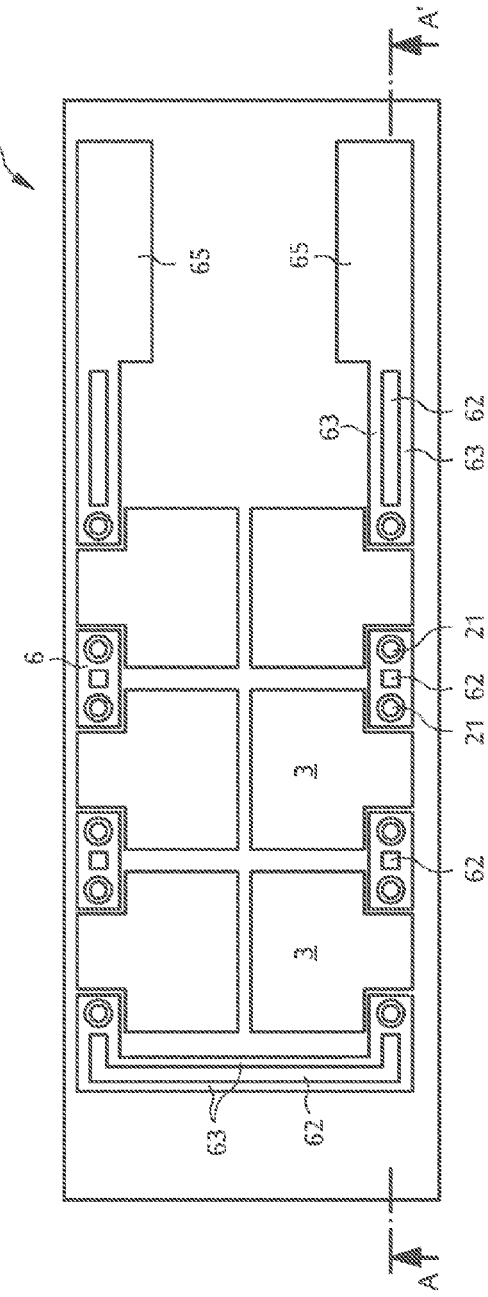

The second exemplary embodiment shown in FIGS. 2A and 2B corresponds substantially to the first exemplary embodiment described in connection with FIGS. 1A and 1B. In contrast thereto, the contact tracks 6 in each case comprise a cutout 62, by means of which two sub-regions 63 extending parallel to one another are formed. It goes without saying that the contact tracks may also comprise more than two parallel sub-regions. By subdividing the conductor track into a plurality of narrow sub-regions, the flexibility of the contact track is increased with regard to thermo-mechanical loads. Unlike in the exemplary embodiment described, the contact tracks 6 may also have more than one cutout in the transverse direction, i.e. transversely of the main direction of extension thereof. For example, the cutouts may form a honeycomb structure for the contact track. Pores in the contact track 6 are also conceivable.

Figure 3A:
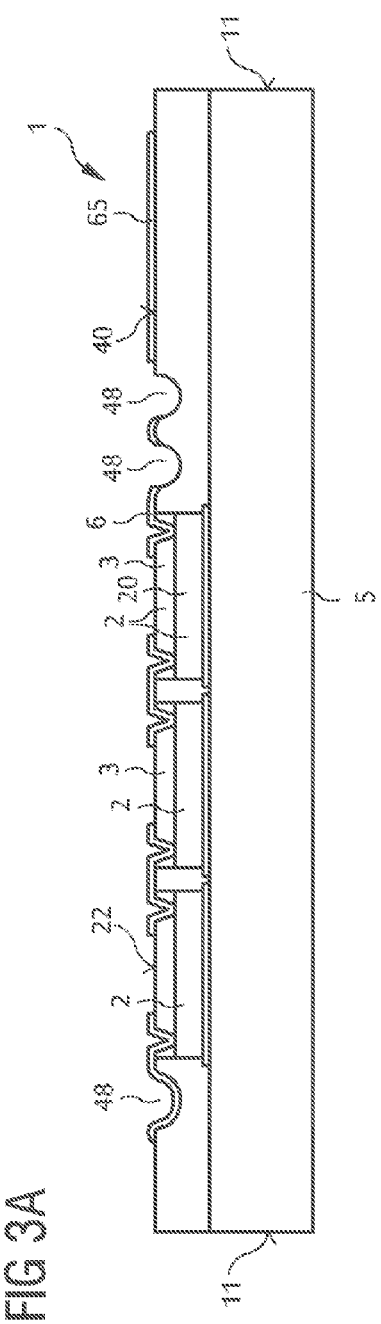
FIGS. 3A and 3B show a third exemplary embodiment of a device in schematic plan view (FIG. 3B) and associated sectional view (FIG. 3A)
Figure 3B:
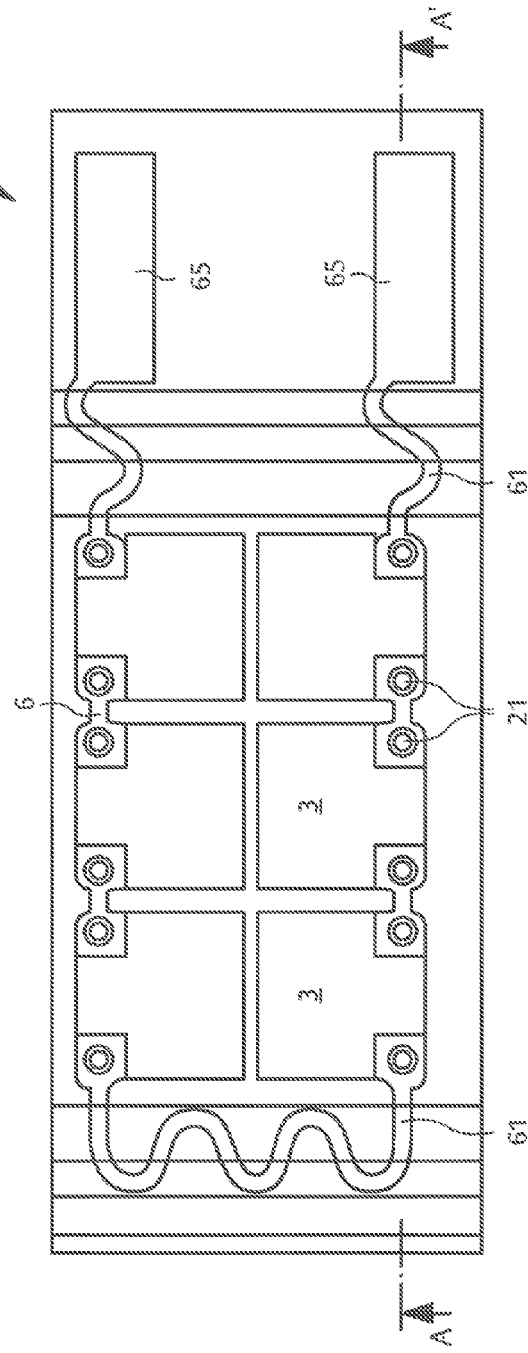

In the third exemplary embodiment shown in FIGS. 3A and 3B, in contrast to the second exemplary embodiment, relief of the contact track with regard to thermo-mechanical loads is achieved by a geometric configuration which brings about a spring effect. Such a spring effect may, as shown in FIGS. 3A and 3B, be achieved by a serpentine structure 61 of the contact track 6. In addition to the structuring of the contact track 6, in this exemplary embodiment the insulation layer 4 comprises a plurality of recesses 48 in the region of the serpentine structure 61. The surface 40 of the insulation layer 4 remote from the carrier 5 is thus not planar in this exemplary embodiment. The contact track 6 follows the surface of the insulation layer in the region of the recesses. The spring effect may be reinforced to a still greater extent by means of the recesses 48.

In the exemplary embodiment shown in FIG. 3B, the recesses 48 extend in the form of trenches, wherein a main direction of extension of the trenches extends in each case parallel to the side faces 25 of the semiconductor components 2 closest to the trenches. In contrast thereto, the insulation layer 4 may however also have another form of structuring or be unstructured. Furthermore, as an alternative or in addition to the serpentine structure of the contact tracks 6, multiple connections of the semiconductor components, for example contact tracks extending in a star shape, may also be provided.

The fourth exemplary embodiment illustrated in FIG. 4 corresponds substantially to the first exemplary embodiment described in connection with FIGS. 1A and 1B. In contrast thereto, the device 1 comprises a further layer 45. The further layer 45 is arranged between the insulation layer 4 and the carrier 5, in particular laterally outside the semiconductor components 2. As in the first exemplary embodiment, the surface 40 of the insulation layer 4 remote from the carrier 5 is arranged flush with the radiation passage face 22 of the semiconductor components 2. In contrast to the first exemplary embodiment, however, the thickness of the insulation layer 4 is reduced. In plan view onto the device 1, the insulation layer 4 completely covers the further layer 45. In respect of material, the further layer 45 may therefore be selected irrespective of optical properties, in particular of reflection properties. The further layer 45 conveniently has a coefficient of thermal expansion which is better adapted to the coefficient of thermal expansion 5 than the insulation layer 4.

The further layer 45 may for example be formed on the carrier 5, for example deposited or produced using an injection moulding process or a transfer moulding process. The insulation layer 4 may be thin enough still to exhibit sufficiently high reflectivity and at the same time to exert only significantly reduced thermo-mechanical stress on the contact track 6. The further layer 45 is preferably at least twice as thick as insulation layer 4.

The exemplary embodiment illustrated in FIG. 5 corresponds substantially to the fourth exemplary embodiment described in connection with FIG. 4. In contrast thereto, The further layer 45 is a prefabricated element, for example a plate of a semiconductor material, for instance silicon. Furthermore, the further layer 45 is spaced laterally from the closest semiconductor component 2. The insulation layer 4 is formed between the side face 25 of the semiconductor component 2 and the further layer 45. The risk of radiation absorption by the further layer 45 of radiation exiting laterally from the semiconductor component 2 may be prevented in this way. The thickness of the insulation layer 4 is thus less in the region overlapping the further layer than laterally of the further layer 45.

The exemplary embodiment illustrated in FIG. 6 differs from the first exemplary embodiment described in connection with FIGS. 1A and 1B in particular in that the carrier 5 comprises a depression 51, in which the semiconductor components 2 are arranged. The semiconductor components are arranged in a common depression. The distance between the semiconductor components may in this way be minimised. In contrast thereto, the semiconductor components 2 may be distributed over two or more depressions. As described in connection with FIG. 4, as a result of the depression the thickness of the insulation layer 4 on the carrier 5 may be reduced in places, in particular laterally of the depression. Only inside the depression, in particular in the region directly adjoining the side face 25, does the thickness of the insulation layer 4 correspond substantially to the vertical extent of the semiconductor components 2. Laterally of the depression 51 the thickness of the insulation layer is preferably at most half as great as in the depression. The vertical extent of the depression is preferably conformed to the semiconductor component 2 such that the semiconductor component arranged in the depression projects out of the depression. The insulation layer 4 and the radiation passage face 22 terminate flush in the vertical direction.

Figure 6:
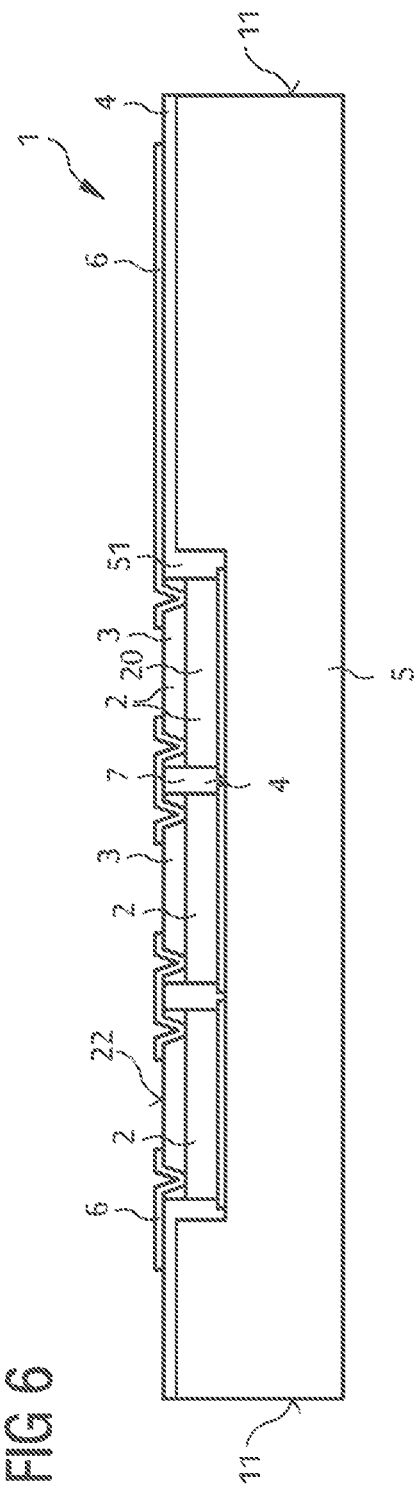
Figure 7:
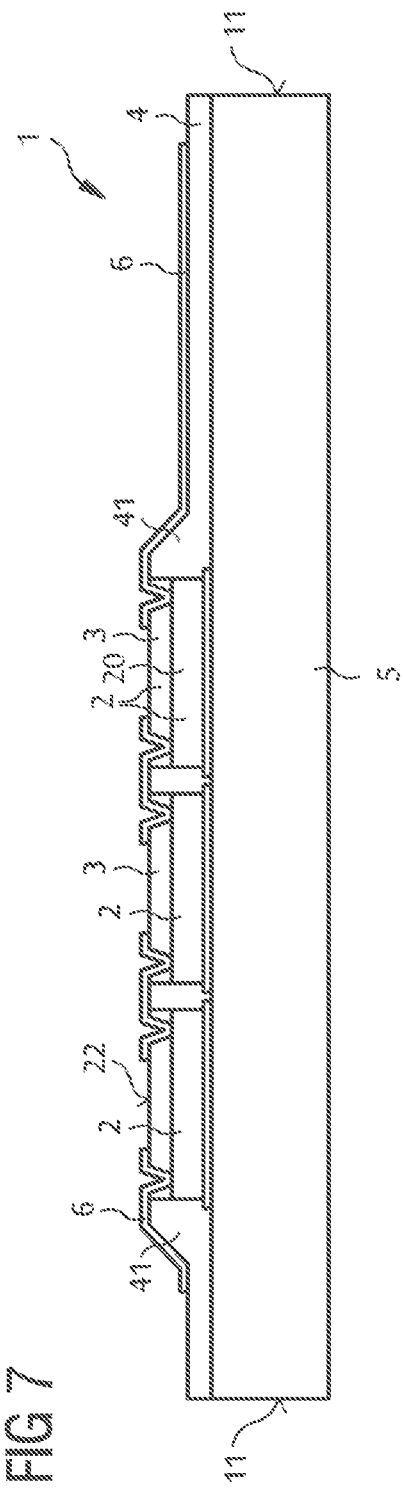

In the seventh exemplary embodiment illustrated in FIG. 7, the reduction in thickness of the insulation layer 4 is achieved, unlike in the exemplary embodiment shown in FIG. 6, in that the carrier 5 is itself planar and the insulation layer 4 comprises a ramp region 41, in which the thickness of the insulation layer decreases as the distance from the closest semiconductor component 2 increases. In a region arranged on the side of the ramp region remote from the closest semiconductor component 2, the insulation layer 4 may have a comparatively small thickness, as described in connection with FIG. 4. The ramp region may be formed by removing material from the insulation layer 4, for example by milling or by laser ablation. Alternatively, the insulation layer may be formed on the carrier in such a way that it already comprises the ramp region, for instance using a mould suitable for an injection or transfer moulding process.

The eighth exemplary embodiment illustrated in FIG. 8 corresponds substantially to the fifth exemplary embodiment described in connection with FIG. 5. In contrast thereto, the further layer 45 comprises a terminal carrier 46 with conductor tracks 47. The terminal, carrier 46 may for example be a printed circuit board, for instance an FR4 printed circuit board. The conductor track. 47 is covered in places by a solder resist layer 49. In a cutout 490 in the solder resist layer 49 the contact track 6 is electrically conductively connected with the conductor track 47 of the terminal carrier. The insulation layer 4 is formed between the terminal carrier 46 and the closest semiconductor component 2. The contact track 6 extends over the insulation layer 4 from the semiconductor component 2 to the terminal carrier 46. Unlike in the first exemplary embodiment described in connection with FIGS. 1A and 1B, the contact track 6 thus forms a merely comparatively short plated bridge. This produces a thermo-mechanically stable electrical connection to the semiconductor component 2.

The ninth exemplary embodiment illustrated in FIG. 9 corresponds substantially to the fifth exemplary embodiment described in connection with FIG. 5. In contrast thereto, the further layer 45 is arranged in an indentation 44 in the insulation layer 4. The indentation may extend vertically completely or only in places through the insulation layer. The further layer forms a filler material, with which the indentation 44 is filled. The indentation may for example be galvanically filled, filled with a solder material, or filled by means of printing. In the region of the indentation, the material of the insulation layer 4 arranged directly over the contact track 6 is completely removed or at least thinned, so reducing the mechanical load on the contact track resulting from thermal expansion of the insulation layer.

This patent application claims priority from German patent application 10 2013 101 260.4, the disclosure content of which is hereby included by reference.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A device having at least one optoelectronic semiconductor component and one carrier, on which the semiconductor component is arranged, wherein
    an insulation layer adjoins and covers a side face that laterally delimits the semiconductor component;
    the insulation layer directly adjoins the carrier at least in regions;
    a contact track is arranged on a radiation passage face of the semiconductor component and connected electrically conductively with the semiconductor component;
    the contact track extends beyond the side face of the semiconductor component and is arranged on the insulation layer;
    the contact track runs on a side of the insulation layer that faces away from the carrier; and
    the contact track has a serpentine structure in a plan view of the device.

2. The device according to claim 1, wherein the contact track has a ductility of at least 10%.

3. The device according to claim 1, wherein the contact track is of multilayer construction and directly adjoins the insulation layer, and wherein the contact track is free of nickel.

4. The device according to claim 1, wherein the contact track has a thickness of at most 30 μm.

5. The device according to claim 1, wherein the contact track is structured with at least one cutout.

6. The device according to claim 5, wherein two sub-regions of the contact track are formed by means of the cutout, the sub-regions extending parallel to one another at least in places in plan view onto the device.

7. The device according to claim 1, wherein a further layer is arranged between the carrier and the contact track laterally outside the semiconductor component.

8. The device according to claim 7, wherein the magnitude of the difference between the coefficient of thermal expansion of the further layer and the coefficient of thermal expansion of the carrier is smaller than the magnitude of the difference between the coefficient of thermal expansion of the insulation layer and the coefficient of thermal expansion of the carrier.

9. The device according to claim 7, wherein the insulation layer is arranged on the side of the further layer remote from the carrier.

10. The device according to claim 7, wherein the further layer is arranged in an indentation in the insulation layer.

11. The device according to claim 7, wherein the insulation layer is arranged between the further layer and the semiconductor component.

12. The device according to claim 11, wherein the further layer comprises a terminal carrier with conductor tracks and the contact track is guided over the insulation layer to the terminal carrier.

13. The device according to claim 1, wherein the carrier comprises a depression, in which the at least one semiconductor component is arranged.

14. The device according to claim 1, wherein the insulation layer comprises a ramp region, in which the thickness of the insulation layer decreases as the distance from the semiconductor component increases.

15. The device according to claim 1, wherein the insulation layer has a reflectivity of at least 80% for the radiation to be generated and/or received by the semiconductor component when the device is in operation.

16. The device according to claim 1, wherein the serpentine structure comprises at least two turns.

17. The device according to claim 1, wherein the insulation layer comprises at least one recess in a region of the serpentine structure.

18. The device according to claim 17, wherein a surface of the insulation layer remote from the carrier is not planar, and
    wherein the contact track follows the surface of the insulation layer in a region of the at least one recess.

19. The device according to claim 1, further comprising a further optoelectronic semiconductor component, wherein the contact track having the serpentine structure extends from the optoelectronic semiconductor component to the further optoelectronic semiconductor component.

* * * * *